(12) United States Patent
Prinz et al.

(10) Patent No.: US 7,989,034 B2
(45) Date of Patent: Aug. 2, 2011

(54) METHOD FOR CONTINUOUS ATMOSPHERIC PRESSURE PLASMA TREATMENT OF WORKPIECES

(75) Inventors: Eckhard Prinz, Hamfelde (DE); Peter Palm, Hamburg (DE); Frank Forster, Hamburg (DE)

(73) Assignee: Softal Corona & Plasma GmbH, Hamburg (DE)

( * ) Notice: Subject to any disclaimer, the term of this patent is extended or adjusted under 35 U.S.C. 154(b) by 879 days.

(21) Appl. No.: 11/993,095

(22) PCT Filed: Jun. 19, 2006

(86) PCT No.: PCT/EP2006/005838
§ 371 (c)(1),
(2), (4) Date: Dec. 20, 2007

(87) PCT Pub. No.: WO2007/000255
PCT Pub. Date: Jan. 4, 2007

(65) Prior Publication Data
US 2010/0221451 A1  Sep. 2, 2010

(30) Foreign Application Priority Data

Jun. 24, 2005 (DE) .......................... 10 2005 029 360

(51) Int. Cl.
*C23C 16/50* (2006.01)
(52) U.S. Cl. ......... 427/569; 118/723 R; 216/67; 216/68; 216/69; 216/70; 216/71
(58) Field of Classification Search .................. None
See application file for complete search history.

(56) References Cited

U.S. PATENT DOCUMENTS

| | | | |
|---|---|---|---|
| 4,863,756 A | 9/1989 | Hartig et al. | |
| 5,597,456 A * | 1/1997 | Maruyama et al. | 204/165 |
| 6,150,430 A * | 11/2000 | Walters et al. | 522/79 |
| 6,489,585 B1 * | 12/2002 | Nakamura et al. | 219/121.52 |
| 2003/0116281 A1 * | 6/2003 | Herbert et al. | 156/379.6 |

FOREIGN PATENT DOCUMENTS

DE  10300439  7/2004

OTHER PUBLICATIONS

Wikipedia reference based on IEC definition of high voltage.*

* cited by examiner

*Primary Examiner* — Timothy H Meeks
*Assistant Examiner* — Joseph Miller, Jr.
(74) *Attorney, Agent, or Firm* — Sand & Sebolt

(57) ABSTRACT

A method for continuous atmospheric plasma treatment of an electrically insulating workpiece. The workpiece is arranged at a distance beneath at least one high-voltage electrode which extends across a direction of movement. The electrode and the workpiece are set in motion relative to one another. The high voltage being applied to the high-voltage electrode, preferably is in the form of an AC voltage. A first space situated between the high-voltage electrode and the workpiece is filled with a first atmosphere and a second space on the side of the workpiece facing away from the high-voltage electrode is filled with a second atmosphere that is different from the first atmosphere. The second space is adjacent to a back side of the workpiece. The choice of high voltage and of the first and second atmospheres is made in such a way that a plasma discharge is ignited in the second atmosphere.

19 Claims, 5 Drawing Sheets

METHOD FOR CONTINUOUS ATMOSPHERIC PRESSURE PLASMA TREATMENT OF WORKPIECES

CROSS-REFERENCE TO RELATED APPLICATIONS

This application is a National Stage entry of PCT/EP2006/005838 filed Jun. 19, 2006, which application claims priority from German Patent Application Serial No. 10 2005 029 360.3, filed Jun. 24, 2005.

BACKGROUND OF THE INVENTION

1. Technical Field

The invention relates to a method for continuous plasma treatment of workpieces. In particular the invention relates to a method of continuous plasma treatment of boards or sheets of material at atmospheric pressure. A plasma treatment in the sense of this invention is understood in particular to refer to a plasma coating.

2. Background Information

In the finishing industry or in the production of plastic films, the latter are activated at the surface by a plasma treatment at atmospheric pressure, also known as a corona treatment. An industrial corona system usually consists of a high-voltage electrode and a counter-electrode designed as a roll and guided over the plastic film, which is in close proximity. The electrode is arranged parallel to the roll, with the electrode being connected to a high voltage of approximately 10 kilovolts at approximately 20-40 kilohertz and the roll being connected to ground potential. Due to the potential difference in the air gap between the high-voltage electrode and the roll with the plastic film, amounting to a few millimeters, a corona discharge develops with conventional practical power outputs of 1 to 5 kilowatts per meter. The plastic film is activated by the corona discharge, i.e., oxidized at the surface.

Due to this activation, the surface tension is increased to thereby ensure adequate adhesion of printing inks and adhesives.

For higher adhesion demands, a primer must be applied to the plastic film after the plasma activation. Primers generally consist mostly of solvent plus a component that improves adhesion. After application of the primer, e.g., by rolling, the solvent must be removed. This is accomplished through a drying tunnel, and in the case of an organic solvent, it must be burned thermally.

This process is thus associated with high investment costs and the costs of ongoing operation in view of the components required—applicator mechanism, drying and afterburning.

Therefore, there have already been attempts for many years to replace wet chemical primer application with a plasma coating process that is performed at atmospheric pressure and does not require a solvent. This eliminates the drying and afterburning. The applicator is then replaced by an atmospheric pressure plasma coating unit.

To do so, a carrier gas, e.g., air, nitrogen, a noble gas or mixtures thereof with precursors, e.g., tetramethyl orthosilicate or hexamethylene disiloxane, is fed into the atmospheric pressure plasma discharge in the electrode system to coat the substrate, which is arranged on the grounded counter-electrode.

In addition to the substrate, the electrode system itself is also coated here. Therefore, the required discharge gap between the electrode system and the counter-electrode is closed and the coating process must be interrupted for cleaning, which is not acceptable for continuous industrial processes.

BRIEF SUMMARY OF THE INVENTION

Against this background, the object of the present invention is to provide a method with which a workpiece can be subjected to an atmospheric-pressure plasma treatment and/or plasma discharge on a side facing away from the electrode.

This object is achieved by a method for continuous atmospheric-pressure plasma treatment and/or plasma coating.

The essential aspect of the inventive method is to create different atmospheres on the side of the workpiece facing the at least one high-voltage electrode and the side of the workpiece facing away from the electrode. Through a suitable adjustment of the two atmospheres and the high voltage, it is possible to achieve the result that in any case a plasma discharge is ignited in the second atmosphere, i.e., the atmosphere on the side of the workpiece facing away from the high-voltage electrode. This permits a treatment, i.e., coating of the back side of the workpiece in a targeted manner.

In the case of a plasma coating in particular, it is possible in this way to avoid coating the at least one high-voltage electrode itself and having to clean it and/or service it at intervals accordingly.

The adjustment of the different atmospheres may be accomplished, for example, by introducing different gases or gas mixtures or by adjusting different pressures. In this context, it should be pointed out that "atmospheric pressure" in the sense of the present invention should also be understood to include pressures which are reduced or elevated with respect to the standard pressure of 1,013 millibar. Pressure differences of approximately +−100 millibar around this normal pressure are still regarded as falling under the term "atmospheric pressure."

In practice, the variant of the adjustment of different atmospheres, i.e., the adjustment by using different gases and/or gas mixtures, will definitely be selected more often. For example, if a plasma discharge is desired only on the back side (i.e., in the second atmosphere), then the gas or gas atmosphere used there will be one that allows a greater free path length and thus a plasma discharge at a lower high voltage than in the first atmosphere. A different gas mixture in the sense of the present invention is also understood to include different gases or gas mixtures in which one of the gas mixtures contains a precursor, while the second gas mixture, which otherwise has the same composition, does not contain a precursor. With such an adjustment, it is possible, for example, to apply a coating to the back side of the workpiece, while implementing only a plasma treatment on the front side (the side facing the high-voltage electrode) by introducing precursors only into the second atmosphere.

In one variant, as indicated above, it is possible to ignite a plasma discharge for a plasma treatment and/or a plasma coating exclusively in the second atmosphere by selecting the first and second atmospheres and the high voltage on the at least one high-voltage electrode accordingly. As an alternative, as already explained above, a plasma discharge may also be triggered in both atmospheres by performing the adjustment of the atmosphere and the high voltage, which is applied to the at least high-voltage electrode, accordingly.

Preferably, the plasma coating of the workpiece is applied only to the back side, i.e., the side where the second atmosphere is located, by introducing chemical reagents (precursors) there—and only there—as starting materials for a coating.

As a rule, at least two high-voltage electrodes which are arranged on one and the same side of the workpiece (in the first atmosphere) are used to create the plasma discharge and/or corona discharge.

The high-voltage electrodes used to perform this method may include both barrier electrodes as well as metal electrodes and combinations of such electrodes (e.g., a barrier electrode and a metal electrode).

BRIEF DESCRIPTION OF THE SEVERAL VIEWS OF THE DRAWINGS

Additional advantages and features of the present invention are derived from the following description of the invention on the basis of exemplary embodiments depicted in the figures which show.

In the figures, the same or similar elements are labeled with the same reference numerals.

DETAILED DESCRIPTION OF THE INVENTION

Figure 1:
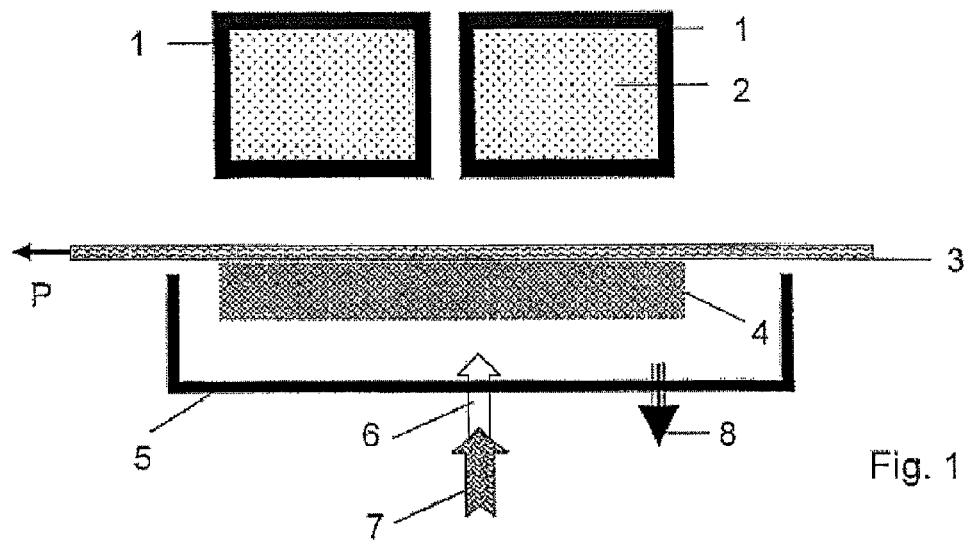
FIG. 1 a schematic sectional view of a device for performing the inventive method in a first variant, shown in a direction of conveyance of a workpiece that is to be treated continuously and/or coated by means of a precursor, using two barrier electrodes as high-voltage electrodes and a plasma discharge on the side of the workpiece facing away from the barrier electrodes.

FIG. 1 shows schematically a device for performing the inventive method, as done with a first variant of such a method. The device includes two barrier electrodes 1 arranged at a distance from the surface of a workpiece 3, a high voltage in the form of an AC voltage preferably being applied to the barrier electrodes. The barrier electrodes 1 have in their interior an electric conductor, which is electrically insulated with respect to the environment by using a barrier material. This material is preferably an aluminum oxide ceramic, which has proven to be especially stable in these applications. The space between the pair of barrier electrodes 1 and the surface of the workpiece 3 (in this case a workpiece path) is filled with a first atmosphere. A housing 5 is arranged on the "back side" of the workpiece 3 facing away from the barrier electrodes 1, and a second space having a second atmosphere is formed inside this housing. This space is charged with a process gas 7 and optionally a precursor 6, as indicated by the two arrows. In this way, a different atmosphere is established in the space in the housing 5 than in the area between the barrier electrodes 1 and the workpiece 3. With a choice of a suitable high voltage, a plasma discharge 4 can be ignited in a targeted manner on the "back side" of the workpiece 3 due to these different atmospheres, given a choice of a suitable high voltage; this plasma discharge 4 acts as a pure plasma discharge in a process gas to induce a plasma treatment, or when precursors 6 are added, the plasma discharge produces a plasma coating on this side of the workpiece 3. As indicated by the arrow P showing the direction of movement, the workpiece 3 is guided continuously in this direction through the device, which is diagramed schematically, and in this way the entirety of the workpiece is plasma treated, i.e., plasma coated on the "back side." Suction 8 is provided here, i.e., the process gas 7 along with any remaining precursors 6 and species generated in the plasma discharge 4 are removed by suction and sent to a downstream exhaust gas treatment system (not shown here) to prevent unwanted plasma products, such as ozone in particular, from entering the environment. At this point, it should be emphasized again that the precursors (labeled as 6 in the figure schematically) for performing this method need not necessarily be introduced into the housing 5 and therefore introduced into the second atmosphere. It is also equally good for the method to be performed with a pure process gas 7, even without the addition of precursors, to be able to perform a plasma treatment of the workpiece 3 on its "back side."

In the arrangement illustrated in FIG. 1, only one side of the workpiece is selectively plasma-treated and/or plasma-coated in a targeted manner, while the other side remains untreated and/or uncoated. This is especially important because in the case of polymer films, for example, as the workplace 3, untreated polymer surfaces are an absolute prerequisite for many finishing processes, such as sealing in the packaging industry.

FIG. 1 shows that the two barrier electrodes 1, which together form a pair of high-voltage electrodes, are separated by a gap and at a distance from one another. It is important to note here that as long as this gap, i.e., distance between the barrier electrodes 1, is not too great, a continuous plasma discharge 4 is still formed on the back side of the workpiece 3. Those skilled in the art will attempt to perform the adjustment of the gap shown in FIG. 1 on the basis of their technical expertise or simple experimental series.

The arrangement of the barrier electrodes shown in FIG. 1 is not restrictive. Multiple barrier electrodes 1 may equally well be arranged on each side of the gap shown there without leaving a wider gap or being aligned during next to one another. It is also possible to provide more than two barrier electrodes 1 separated by a gap from one another as the electrode arrangement.

For example, air nitrogen, carbon dioxide, hydrogen or noble gases such as argon or mixtures of these gases are suitable as the process gas 7. Suitable precursors 6 include, for example, tetramethyl orthosilicate, hexamethylene disiloxane in the gas phase or gaseous precursors, e.g., silane. For example, a silicon dioxide layer in the range of a few nanometers to micrometers may be deposited on the "back" surface of the workpiece by using these precursors. Such a layer constitutes a substitute for the function of a wet chemical primer. Depending on the type of precursors, however, other types of layers with other chemical functions and other effects may also be deposited as antiadhesion, antiscratch or barrier layers.

The barrier electrodes 1 shown in the exemplary embodiment may have a length of up to several meters. The conductors 2 to be provided to establish a potential difference between the barrier electrodes 1 in the course of the high voltage (AC voltage) may be, for example, a metal powder filling or a metal coating of the barrier electrodes 1 from the inside. The preferred barrier electrodes 1 are those made of rectangular tubes with one or more channels each.

In this exemplary embodiment, a sinusoidal voltage between 10 and 60 kilovolt with a frequency of 1 to 100 kilohertz, preferably 5 to 30 kilohertz is used in executing the inventive method. The voltage may also be pulsed here.

Figure 2:
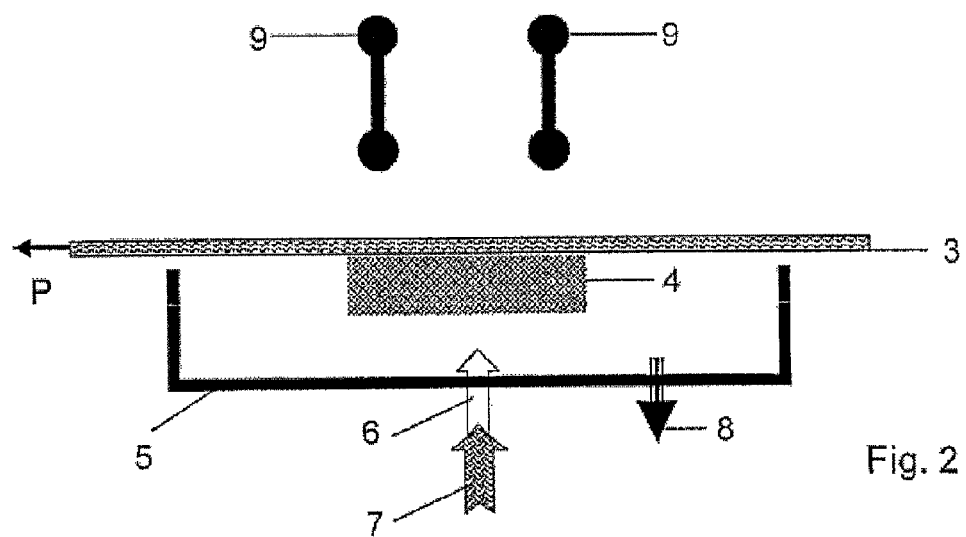
FIG. 2 in a view like that of FIG. 1, an alternative device with metal electrodes instead of barrier electrodes.
Figure 3:
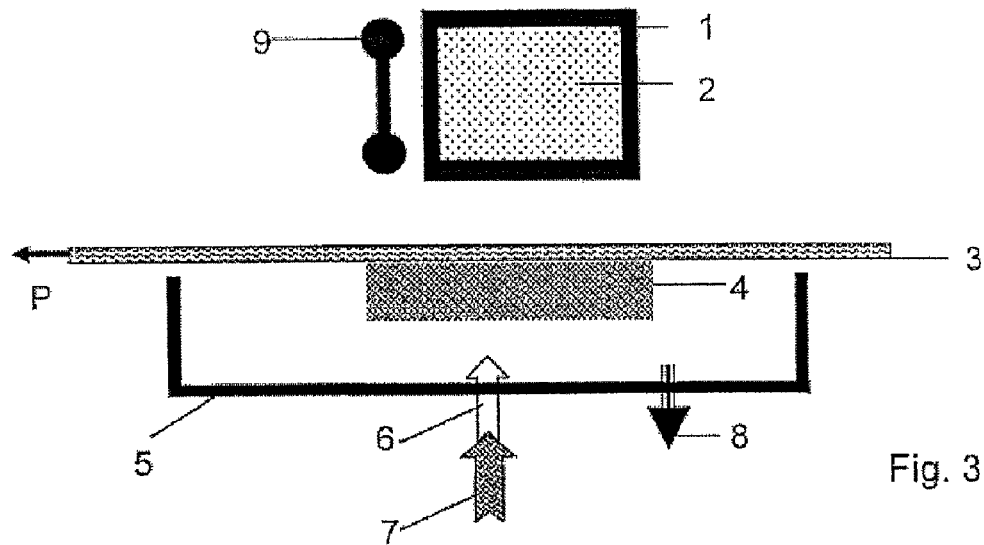
FIG. 3 in a view like that in FIG. 1, another alternative device with a combined electrode arrangement comprising a metal electrode and a barrier electrode.
Figure 4:
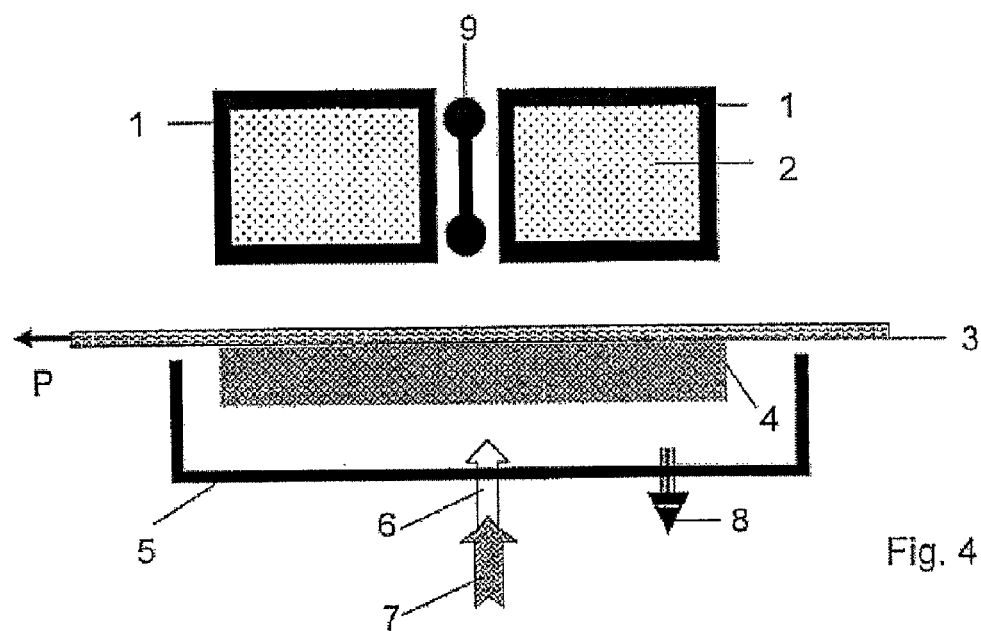
FIG. 4 in a view like that in FIG. 1, another alternative device with a combined electrode arrangement with one metal electrode between two barrier electrodes.
Figure 5:
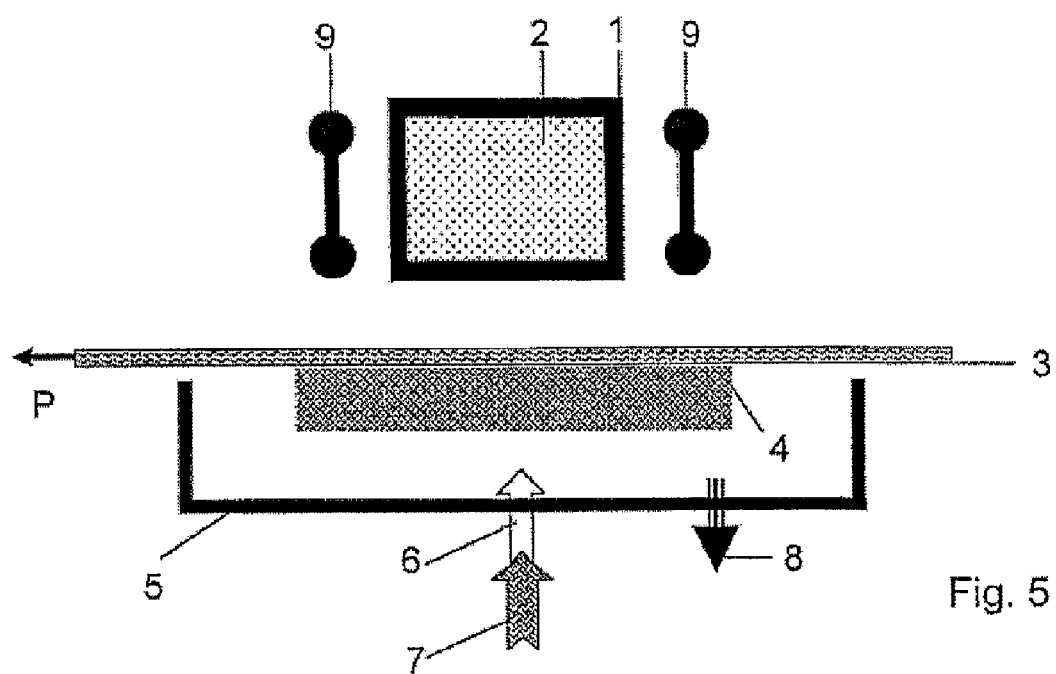
FIG. 5 in a view like that in FIG. 1, another alternative device with a combined electrode arrangement with a barrier electrode arranged between two metal electrodes.

In FIGS. 2 through 5, which otherwise show a similar discharge situation, different electrode arrangements that are suitable for use with the inventive method are shown, although they do not constitute a definitive representation. FIG. 2 shows an arrangement similar to that in FIG. 1, with the high-voltage electrodes shown there being metal electrodes 9. Different electrode arrangements comprising barrier electrodes 1 and metal electrodes 9, which are also suitable for performing the inventive method, are shown in the additional FIGS. 3 through 5.

A device for performing the inventive method in a second variant is illustrated in FIGS. 6 through 9—likewise with a different assembly of the electrode arrangement with barrier electrodes 1 and metal electrodes 9.

Figure 6:
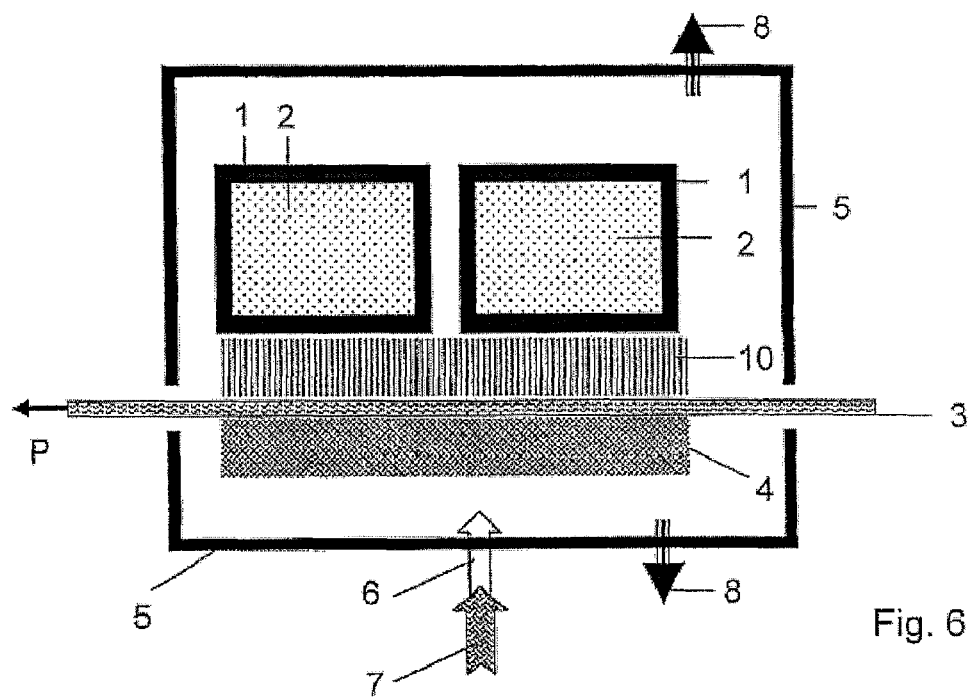
FIG. 6 a diagram of a device like that in FIG. 1, but here a plasma discharge occurs on both sides of the workpiece through control of the method.
Figure 7:
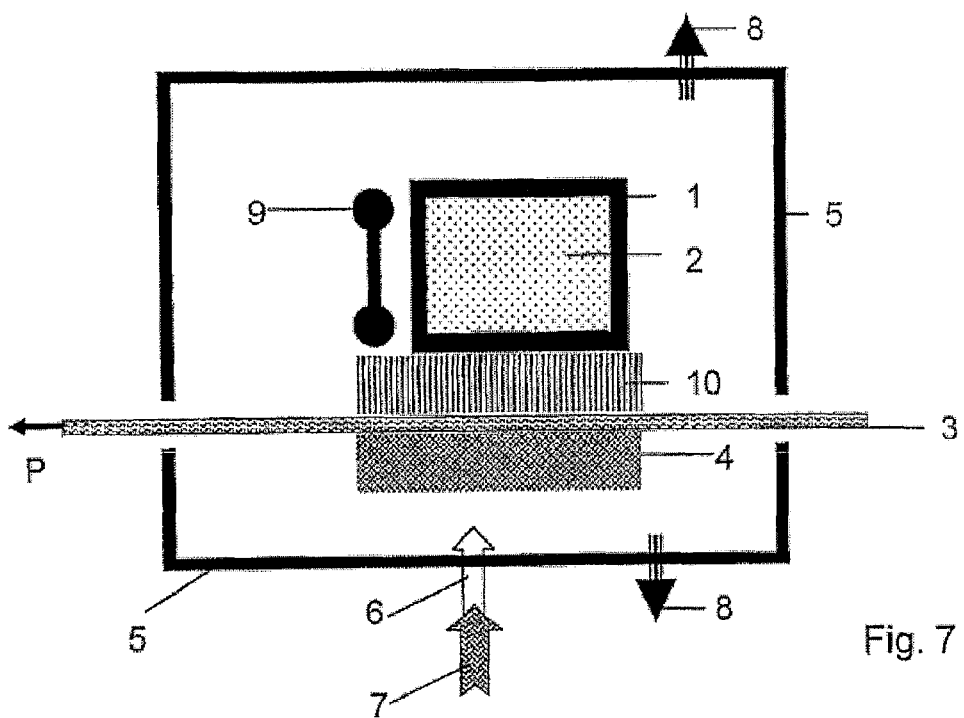
FIG. 7 a diagram of a device like that in FIG. 3, but here a plasma discharge occurs on both sides of the workpiece through control of the method.
Figure 8:
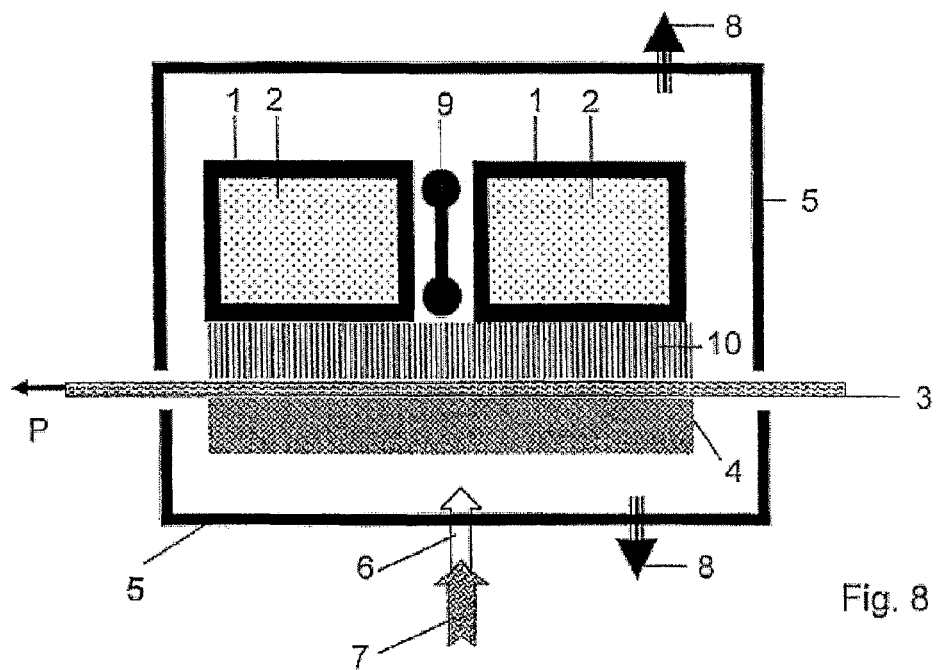
FIG. 8 a diagram of a device like that in FIG. 4, but here a plasma discharge occurs on both sides of the workpiece through control of the method.
Figure 9:
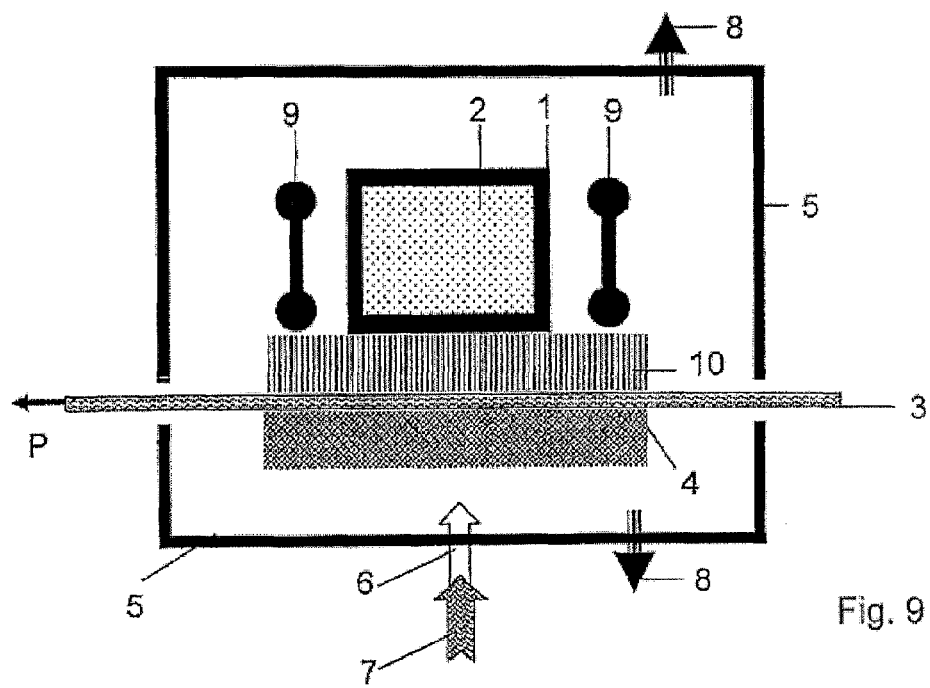
FIG. 9 a diagram of a device like that in FIG. 5, but with a plasma discharge occurring on both sides of the workpiece here through control of the method.

This method and the procedure by which it is carried out will be described in greater detail with reference to FIG. 6. This method functions equally with equipment having electrode arrangements with a different composition, so no further description is necessary here.

In the case illustrated in FIGS. 6 through 9, a housing 5 surrounds a space (a first space on the "front side" and a second space on the "back side") on both the "back side" of the workpiece and on the "front side" which faces the electrode arrangement. The second space is charged with a process gas 7 and optionally with added precursors 6 as depicted and described in conjunction with the FIGS. 1 through 5 and is connected to a suction exhaust 8. Therefore, in this variant of the process, a plasma discharge 4 is also ignited in a targeted manner on the "back side" of the workpiece 3.

In the present exemplary embodiment, unlike the exemplary embodiment described above, the atmosphere in the first space (the space enclosed in a housing 5, containing the electrode arrangement) is selected in accordance with the high voltage applied so that a plasma discharge 10 is also ignited here. Here again, a process gas may be fed into this space (not shown in the figures), and this process gas differs in composition from the process gas 7, which is fed from the space enclosed by the housing 5 on the "back side" of the workpiece 3. The space enclosed by the housing 5 on the side of the workpiece 3 containing the electrode arrangement is also connected to a suction exhaust 8 to remove the reaction products, ozone in particular, formed by the plasma discharge 10 and render it harmless.

It is crucial here that a supply of precursors is provided only on the "back side" of the workpiece in the exemplary embodiment shown here, but precursors are not introduced into the plasma discharge 10 onto the electrode side in order to avoid coating of the high-voltage electrodes (barrier electrodes 1/metal electrodes 9).

In the second variant shown here, the inventive method allows a plasma treatment and/or plasma coating on the "back side" of the workpiece 3 and at the same time a plasma treatment on the "front side" facing its electrode arrangement.

The exemplary embodiments illustrated and described here do not restrict the scope of the claimed invention and serve only to provide a more extensive explanation thereof.

LIST OF REFERENCE NOTATIONS

1 Barrier electrode
2 Electric conductor
3 Workpiece
4 Plasma discharge
5 Housing
6 Precursor
7 Process gas
8 Suction exhaust
9 Metal electrode
10 Plasma discharge (electrode side)
P Arrow (direction of movement)

The invention claimed is:

1. A method for continuous atmospheric-pressure plasma treatment of electrically insulating workpieces, wherein an electrically insulating workpiece to be treated is arranged at a distance below a high-voltage electrode and the electrode and the work piece are set in motion in relation to one another in a direction of movement, and the electrode extends across the direction of movement, at least over the width of the surface of the workpiece to be treated, and wherein the plasma treatment occurs at atmospheric pressure and a high-voltage is applied to the high-voltage electrode; wherein a first space situated between the high-voltage electrode and the workpiece is filled with a first atmosphere having a first gas composition, where the first space is of a kind where the electrode does not directly contact the workpiece, and a second space situated on a side of the workpiece facing away from the high-voltage electrode and adjacent to a back side of the workpiece is filled with a second atmosphere that has a second gas composition, and wherein the second gas composition is a different gas or gas mixture than the first gas composition, and where the choice of voltage and the first and second atmospheres is made in such a way that a plasma discharge is ignited in only the second atmosphere.

2. The method as defined in claim 1, wherein the choice of voltage and of the first and second gas compositions for the first and second atmospheres is made in such a way that a plasma discharge is ignited exclusively in the second atmosphere.

3. The method as defined in claim 1, wherein chemical reagents or precursors are introduced into the second atmosphere as starting materials for a plasma coating on the side of the workpiece facing away from the high-voltage electrode.

4. The method as defined in claim 1, wherein at least two high-voltage electrodes arranged on the same side of the workpiece is are used to create the plasma discharge.

5. The method as defined in claim 1, wherein at least one barrier electrode is a component of the high-voltage electrode; and wherein the barrier electrode includes a conductor and an insulating material.

6. The method as defined in claim 1, wherein at least one metal electrode is a component of the high-voltage electrode.

7. The method as defined in claim 4, wherein the plasma discharge is a corona discharge.

8. The method as defined in claim 7, wherein a pair of electrodes is used to create the corona discharge.

9. The method as defined in claim 1, wherein the workpieces are boards or sheets of material.

10. The method as defined in claim 1, wherein the workpiece is spaced a distance from two or more electrodes, and wherein adjacent electrodes are separated from each other by a gap.

11. The method as defined in claim 1, wherein the high voltage is an alternating current voltage.

12. The method as defined in claim 1, wherein the plasma treatment comprises plasma coating the back side of the work piece.

13. A method for continuous atmospheric-pressure plasma treatment of electrically insulating workpieces comprising:

providing a workpiece to be treated, wherein the workpiece has a first side and a second side and is electrically insulating;

positioning the workpiece to be treated within a housing and disposed a distance away from a high-voltage electrode such that the first side of the workpiece is positioned proximate the electrode and the second side of the workpiece is disposed remote from the electrode; and wherein a first space is defined between the first side of the workpiece and the electrode and a second space is defined between the second side of the workpiece and a surface of the housing;

creating a first atmosphere in the first space using first gas composition;

creating a second atmosphere in the second space using a second gas composition;

moving one of the workpiece and electrode in a first direction of movement relative to the other of the workpiece and the electrode;

subjecting the workpiece and electrode to atmospheric pressure; applying a high voltage to the electrode;

igniting a plasma discharge in the second atmosphere as a result of the choice of voltage and choice of the first and second gas compositions in the first and second atmospheres, where the second gas composition is a different gas or gas mixture from the first gas composition; and plasma-treating only the second side of the workpiece with the plasma discharge.

14. The method as defined in claim 13, wherein the electrodes are only provided proximate the first side of the workpiece and the second space is free of electrodes.

15. The method as defined in claim 13, further comprising the step of introducing chemical reagents or precursors into the second atmosphere as starting materials for a plasma coating on the second side of the workpiece facing away from the high-voltage electrode.

16. The method as defined in claim 13, wherein at least two high-voltage electrodes arranged on the same side of the workpiece are used to create the plasma discharge.

17. The method as defined in claim 13, wherein at least one barrier electrode is a component of the high-voltage electrode; and wherein the barrier electrode includes a conductor and an insulating material.

18. The method as defined in claim 13, wherein at least one metal electrode is a component of the high-voltage electrode.

19. The method as defined in claim 13, wherein the plasma treatment comprises plasma coating the second side of the work piece.

* * * * *

UNITED STATES PATENT AND TRADEMARK OFFICE
CERTIFICATE OF CORRECTION

| | | |
|---|---|---|
| PATENT NO. | : 7,989,034 B2 | Page 1 of 1 |
| APPLICATION NO. | : 11/993095 | |
| DATED | : August 2, 2011 | |
| INVENTOR(S) | : Prinz et al. | |

It is certified that error appears in the above-identified patent and that said Letters Patent is hereby corrected as shown below:

Column 6, line 55 (Claim 4) change the phrase "is are used to" to --are used to--

Signed and Sealed this
Twentieth Day of September, 2011

David J. Kappos
*Director of the United States Patent and Trademark Office*